(12) United States Patent
Hung et al.

(10) Patent No.: US 8,237,462 B2
(45) Date of Patent: Aug. 7, 2012

(54) METHOD FOR WAFER-LEVEL TESTING OF INTEGRATED CIRCUITS

(75) Inventors: Tsung-Yang Hung, Zhubei (TW); Aaron Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 406 days.

(21) Appl. No.: 12/539,328

(22) Filed: Aug. 11, 2009

(65) Prior Publication Data
US 2011/0037494 A1 Feb. 17, 2011

(51) Int. Cl.
G01R 31/02 (2006.01)
G01R 31/26 (2006.01)

(52) U.S. Cl. ............................. 324/762.01; 324/762.05

(58) Field of Classification Search .................... None
See application file for complete search history.

(56) References Cited

U.S. PATENT DOCUMENTS

| | | | | |
|---|---|---|---|---|
| 5,949,246 A | * | 9/1999 | Frankeny et al. | 324/750.05 |
| 6,094,060 A | * | 7/2000 | Frankeny et al. | 324/750.03 |
| 7,385,410 B2 | * | 6/2008 | Payman | 324/762.03 |
| 2003/0222671 A1 | * | 12/2003 | Cram | 324/765 |
| 2006/0038172 A1 | * | 2/2006 | Akram | 324/158.1 |
| 2010/0229383 A1 | * | 9/2010 | Chao et al. | 29/840 |

OTHER PUBLICATIONS

London, Arnie, et al., "Use of Voltage Stressing at Wafer Probe for Reliability Predictions," IEEE Transactions on Semiconductor Manufacturing, vol. 12, No. 4, Nov. 1999, pp. 516-522.

Quach, Minh, et al., "Wafer-Level Defect-Based Testing Using Enhanced Voltage Stress and Statistical Test Data Evaluation," ITC International Test Conferences, 2002, pp. 683-692.

Tsao, Chung-Yuan, et al., "Applying Dynamic Voltage Stressing to Reduce Early Failure Rate," IEEE 39th Annual International Reliability Physics Symposium, 2001, pp. 37-41, Orlando, Florida, USA.

* cited by examiner

*Primary Examiner* — Jermele M Hollington
(74) *Attorney, Agent, or Firm* — Haynes and Boone, LLP (57) ABSTRACT

A method for wafer level testing is provided which includes providing a wafer having an integrated circuit formed thereon, applying a signal to energize the integrated circuit, the signal including increasing steps or decreasing steps that range between a first level and a second level, and determining whether the integrated circuit complies with a test criteria after applying the signal.

20 Claims, 6 Drawing Sheets

METHOD FOR WAFER-LEVEL TESTING OF INTEGRATED CIRCUITS

BACKGROUND

In semiconductor fabrication, a wafer typically undergoes numerous processes to form an integrated circuit. Various wafer-level tests are performed to determine performance and reliability of the integrated circuit under various conditions and wafer acceptance testing. Wafer-level reliability testing is utilized for detecting early life failure associated with defects generated during fabrication of the integrated circuit. Generally, reliability testing involves stressing the integrated circuit by various techniques such as power cycling on/off and applying voltages that exceed normal operating conditions. However, current testing techniques may provide invalid reliability assessment due to unexpected damage or degradation of the integrated circuit during testing. For example, parasitic inductance and capacitance of the test setup (e.g., probe package) may induce high damping voltage coupling to radio frequency (RF) components (e.g., LC tank circuit) of the integrated circuit which can cause unexpected damage to the integrated circuit.

SUMMARY

One of the broader forms of an embodiment of the present invention involves a method for wafer level testing. The method includes providing a wafer having an integrated circuit formed thereon; applying a signal to energize the integrated circuit, the signal including a plurality of increasing steps or decreasing steps that range between a first level and a second level; and determining whether the integrated circuit complies with a test criteria after applying the signal.

Another one of the broader forms of an embodiment of the present invention involves an system for semiconductor device testing. The system includes a signal generator operable to generate a signal, the signal including a plurality of increasing steps or decreasing steps that range between a first voltage level/current level and a second voltage level/current level; a coupler operable to couple the signal generator to an integrated circuit formed on a wafer; and a module operable to determine whether the integrated circuit complies with a test criteria after the signal is applied to the integrated circuit.

Yet another one of the broader forms of an embodiment of the present invention involves a method for testing a semiconductor device. The method includes providing the semiconductor having an integrated circuit to be tested, the integrated circuit including an inductive element and a capacitive element; performing a plurality of tests on the integrated circuit, each test including applying a quasi-ramping signal to power on and off the integrated circuit, the quasi-ramping signal including a plurality of steps that range between a first voltage to a second voltage; and determining whether the integrated circuit complies with a test criteria associated with the respective test.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
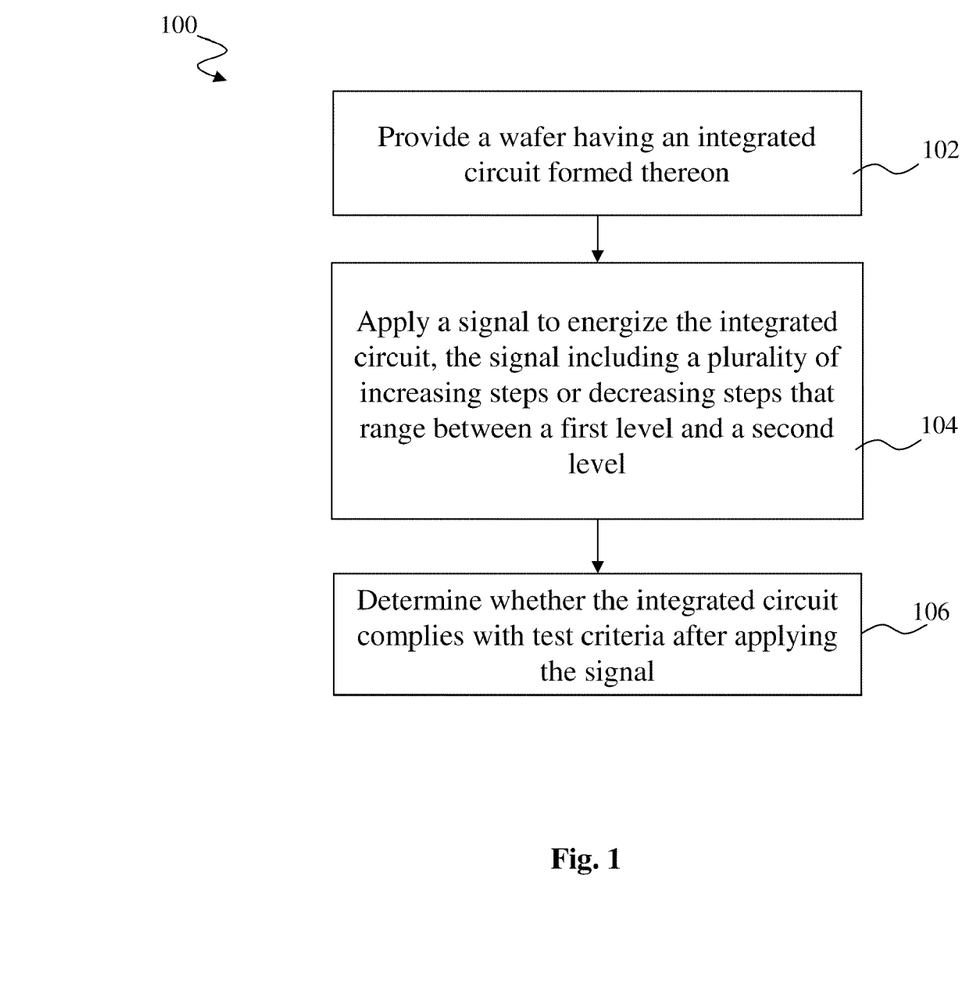
FIG. 1 is a flowchart of a method for testing an integrated circuit according to various aspects of the present disclosure.

Referring to FIG. 1, illustrated is a flowchart of a method 100 of testing an integrated circuit according to various embodiments of the present disclosure. The method 100 can be implemented to power the integrated circuit in various wafer level tests. The wafer level tests includes electrically testing the integrated circuit while it is still in wafer form. The method 100 begins with block 102 in which a wafer is provided that includes an integrated circuit formed thereon. The wafer undergoes numerous semiconductor fabrication processes known in the art to form an integrated circuit. The integrated circuit includes various types of circuits and devices such as logic circuits, memory circuits, radio frequency circuits, high voltage circuits, input/output devices, system-on-chip devices, etc.

The method 100 continues with block 104 in which a signal is applied to energize the integrated circuit. The signal comprises a plurality of increasing steps or decreasing steps that range from a first level to a second level. The first and second levels may include voltage levels. Further, it should be noted that the signal may also comprise of a plurality of increasing steps or decreasing steps that range from a first current level to a second current level. For example, an integrated circuit (e.g., CMOS integrated circuit) may be biased at constant current in operation mode and set at zero bias current in standby mode instead of turning down the voltage. Accordingly, such an integrated circuit may be power ramped up/down by the bias current. This can be referred to as current ramping mode. The discussion below describes a quasi-power ramping signal that can power an integrated circuit both in a voltage stepping mode or a current stepping mode, and may be referred to as a signal ranging from a first voltage level/current level to a second voltage level/current level. The number of steps and the voltage/current step size may vary depending desired test conditions as will be explained in detail later. The method 100 continues with block 106 in which it is determined whether the integrated circuit complies with test criteria after applying the signal. The test criteria may be associated with a particular test as will be explained in greater detail.

Figure 2:
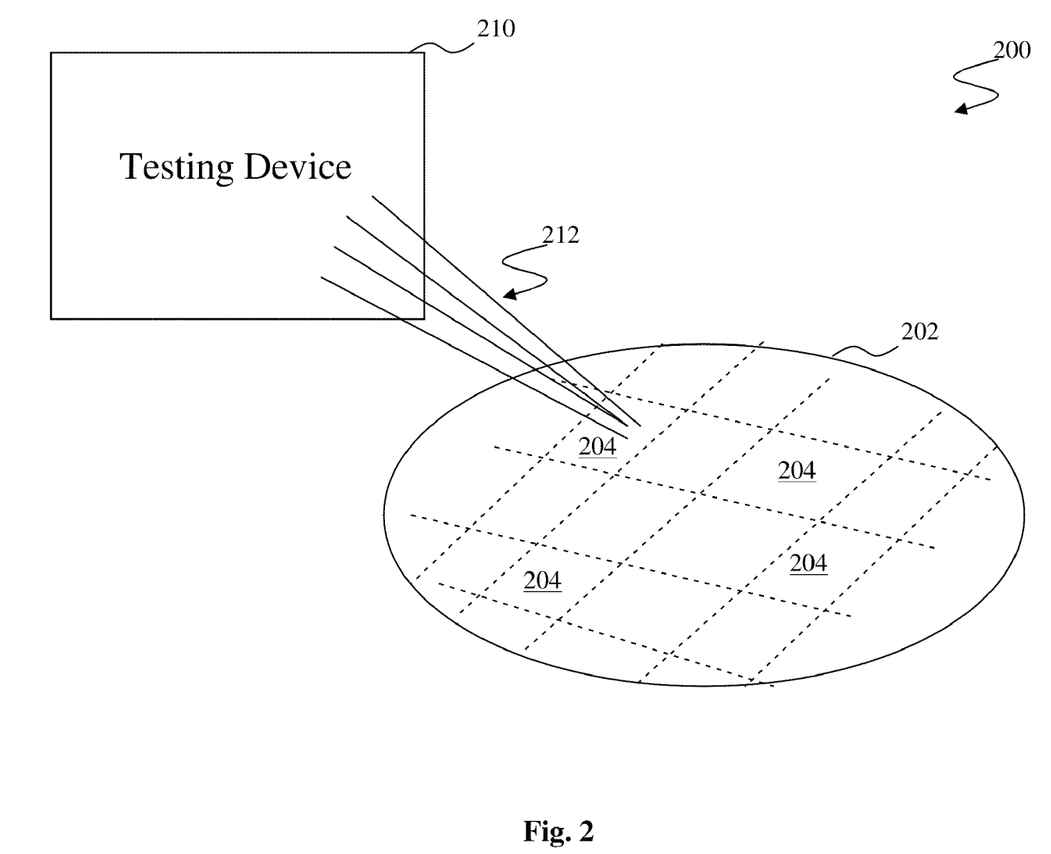
FIG. 2 is a diagrammatic view of a system in which the method of FIG. 1 can be practiced according to various aspects of the present disclosure.

Referring to FIG. 2, in an illustrative embodiment, a system 200 in which the method 100 of FIG. 1 may be practice in is provided. The system 200 includes a wafer 202 to be tested. The wafer 202 may be referred to as a device under test (DUT). The wafer 202 may comprise an elementary semiconductor such as silicon, germanium, and diamond. In other embodiments, the wafer 202 may comprise an alloy semiconductor such as silicon germanium and silicon germanium carbide. The wafer 202 may include one or more dies 204 (or chips) formed thereon. Each die 204 comprises of an integrated circuit, and the dies 204 may comprise of the same or different integrated circuits. Scribe lines may be provided between adjacent dies 204 so that the dies can be separated in subsequent processing. The system 200 further includes a testing device 210 of a type known in the art. The testing device 210 may include an automatic test equipment (ATE). The testing device 210 is operable to perform various wafer-level tests such as power cycling, dynamic voltage stress (DVS), continuity test, AC/DC test, parameter scanning, functionality test, quiescent supply current (IDDQ) test, and other suitable tests.

The testing device 210 may include hardware and software components that provide a suitable operational and functional environment for the tests. For example, the testing device 210 may include a computer, test programs, signal generator, probe module, measuring instrument, etc. The testing device 210 may be coupled to the die 204 by a plurality of probes 212. The probes 212 may be part of a probe head or probe package. The probes 212 may be electrically coupled to test pads and/or bonding pads disposed on the dies 204. The test pads and/or bonding pads provide electrical connections to an interconnect structure (e.g., wiring) of the integrated circuit. For example, some of the probes may be coupled to pads that are associated with a supply terminal (e.g., Vdd) and ground terminal (e.g., Vss) of the integrated circuit. Other probes may be coupled to pads associated with input/out (I/O) terminals (e.g., data signals) of the integrated circuit. As such, the testing device 210 is operable to apply electrical signals (e.g., test patterns) to the integrated circuit and obtain response signals from the integrated circuit during testing. The response signals may be evaluated with respect test criteria to determine whether the integrated circuit of a particular die 204 is defective or not.

Figure 3:
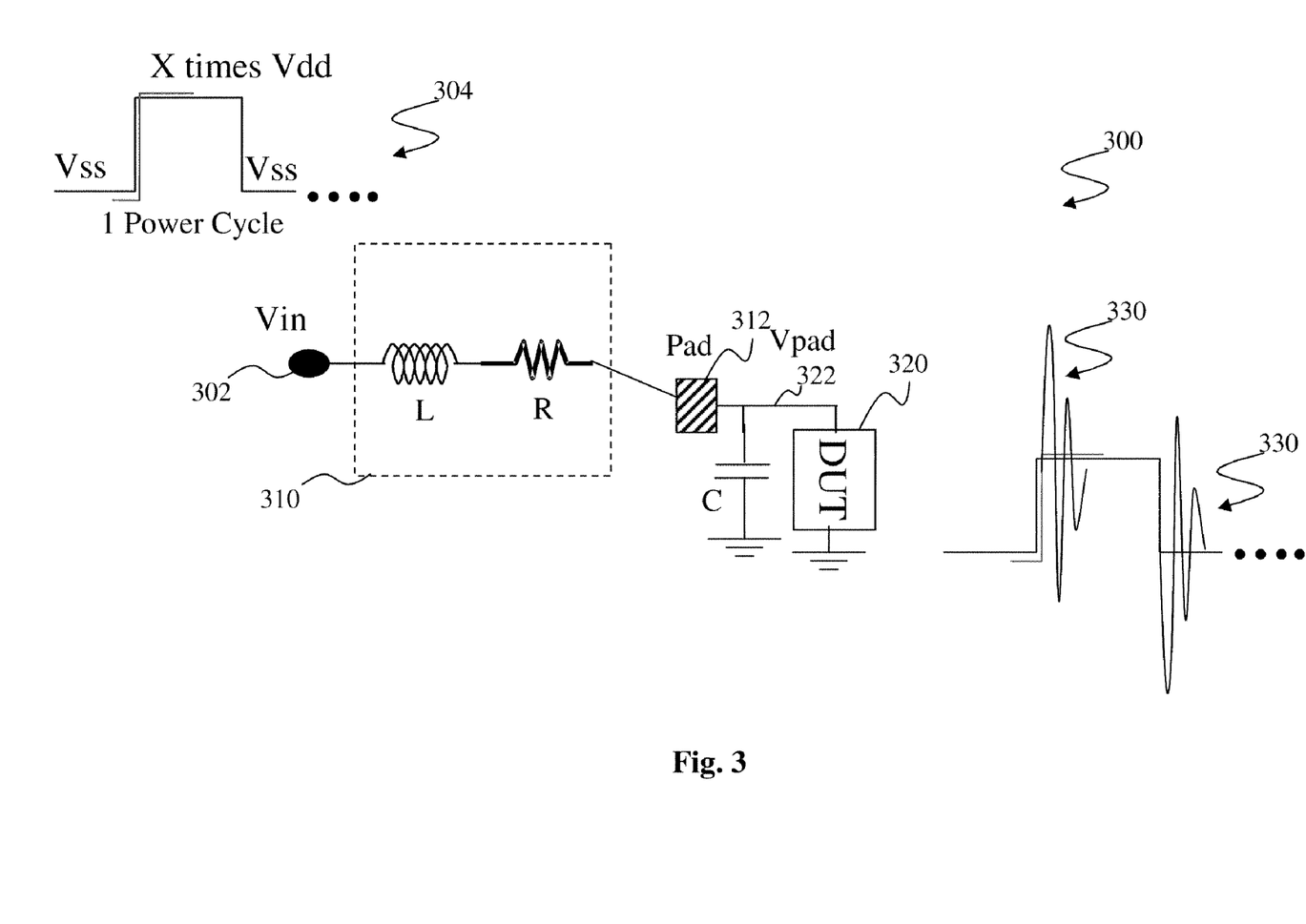
FIG. 3 is a circuit representation of a device under test (DUT) using a single step power signal.

Referring to FIG. 3, illustrated is a circuit representation 300 of a device under test (DUT) being energized with a single step power signal The circuit representation 300 includes an input terminal 302 (Vin) for supplying a power signal 304. The power signal 304 may be supplied, for example, by the testing device 210 of FIG. 1. The input terminal 302 is coupled to a probe package 310 that is depicted as including an equivalent inductive element L and a equivalent resistive element R. It has been observed that the equivalent inductive element L may range from about 5 to about 30 nH, and the equivalent resistive element R may be about 0.5 ohm in one example. The probe package 310 includes a probe that is connected to a pad 318. The pad 318 is connected to a power supply terminal of a DUT 320 for energizing the DUT during testing. The voltage/current level at the power supply terminal of the DUT 320 may be referred to as Vpad 322. The circuit representation 300 includes a capacitive element C that is coupled at Vpad across the DUT 320. The capacitive element C may represent a total parasitic capacitance of pads and metal lines of the test setup.

The power signal 304 is applied to energize the DUT 320 for various types of wafer-level tests such as such as power cycling, dynamic voltage stress, continuity test, AC/DC test, parameter scanning, functionality test, and other suitable tests. It is understood that other electrical signals such as data signals and clock signals may be provided to the DUT but are not illustrated for the sake of clarity and simplicity. In the present embodiment, the power signal 304 includes a single step signal that ranges from ground/0 V or zero bias current/0 mA (e.g., Vss) to a positive supply voltage/current (e.g., Vdd). It is noted that other DUTs may operate at a negative supply voltage/current. The positive supply voltage/current can be expressed as X times Vdd. In some tests, the DUT 320 may be energized with normal operating voltages where X=1, such as power cycling test. In other tests, the DUT 320 may be energized with voltages that exceed normal operating voltage where X>1, such as 1.4 times Vdd in dynamic voltage stress (DVS) testing.

It has been observed that there may be an overshoot voltage 330 experienced at Vpad 322 when the power signal 304 transitions from 0 V/0 mA to a positive supply voltage/current, and again when the power signal 304 transitions from the positive supply voltage/current to 0 V/0 mA. The overshoot voltage 330 may be generated due to the inductive element L and the capacitive element C (e.g., parasitic LC) of the test setup. The amount of overshoot will depend on the voltage/current step size. The overshoot voltage 330 may cause unexpected damage to the DUT 320, particularly to DUTs that have RF components. In some situations, it has been observed that the parasitic LC may induce approximately two times Vdd damping voltage coupling (e.g., LC resonance) to the RF network of the DUT. As such, injecting such an overshoot voltage to RF components, such as LC tank circuits, will most likely over-stress the DUT thereby causing damage during testing, and thus may result in invalid reliability assessment of the DUT. One possible solution is to add an RC filter on the probe package to reduce the overshoot voltage at an acceptable level. However, this requires additional costs and modifications to the probe package. Thus, the embodiments disclosed below provide a cost-effective method to reduce the overshoot voltage that can easily be implemented with a suitable test program.

Figure 4:
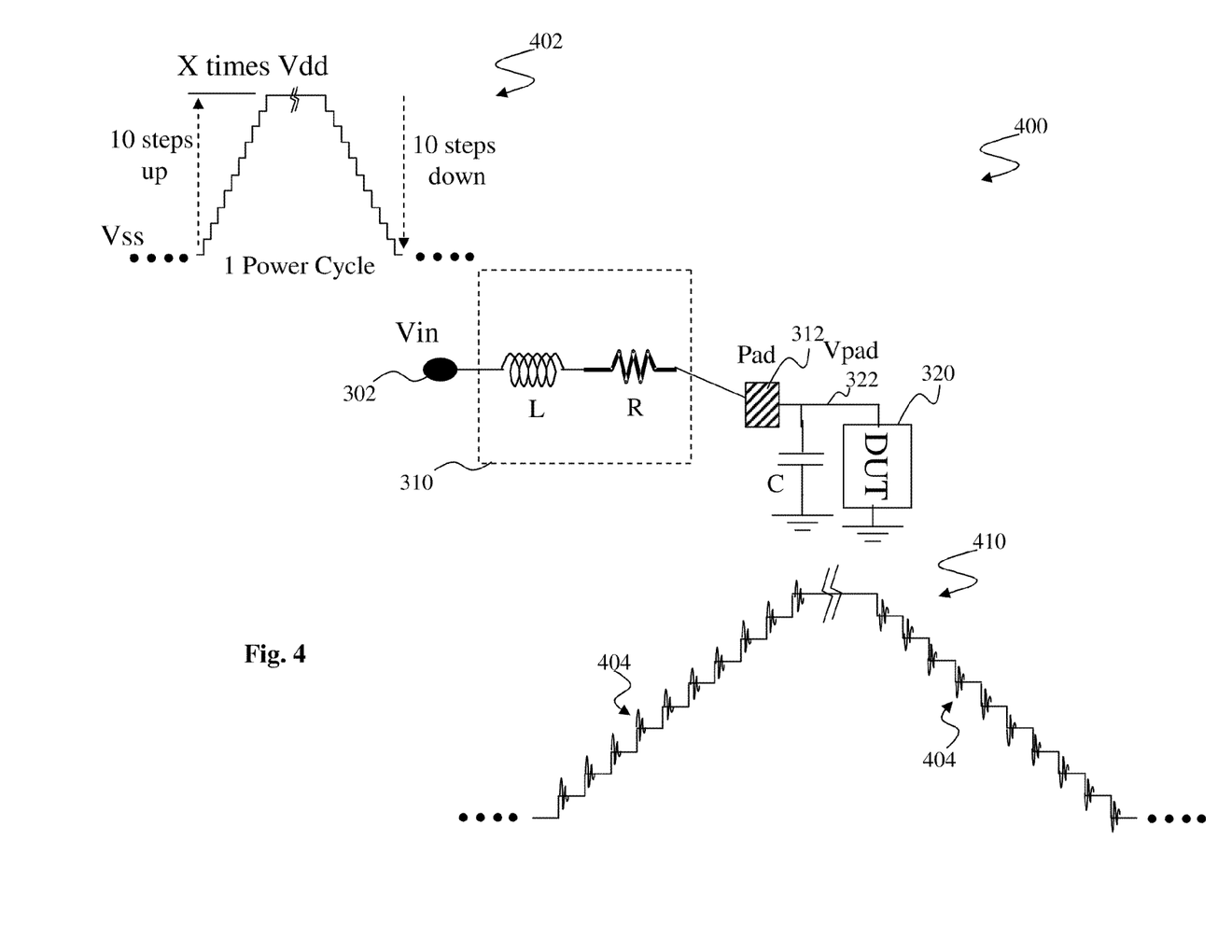
FIG. 4 is a circuit representation of a device under test (DUT) using quasi-power ramping according to various aspects of the present disclosure.

Referring to FIG. 4, illustrated is a circuit representation 400 of a device under test (DUT) energized with a quasi-power ramping signal according to various aspects of the present disclosure. The circuit representation 400 is similar to the circuit 300 of FIG. 3 except that the power supply signal comprises a quasi-power ramping signal 402 instead of the single step power signal 304 of FIG. 3. Accordingly, similar features in FIGS. 3 and 4 are numbered and referenced the same for the sake of simplicity and clarity. The quasi-power ramping signal 402 may be generated with a suitable test program that controls a signal generator. The test program may specify number of steps, test voltage/current, step size, step time (or dwell time), and ramping time. Although one power cycle is shown, it is understood that the number of power cycles may vary depending on the particular test to be performed. In the present embodiment, the quasi-power ramping signal 402 ranges from ground/0 V (e.g., Vss) to a positive supply voltage (e.g., Vdd). It is noted that other DUTs may operate at a negative supply voltage. The positive supply voltage can be expressed as X times Vdd. In some tests, the DUT 320 may be energized with a normal operating voltage where X=1, such as power cycling test. In other tests, the DUT 320 may be energized with voltages that exceed normal operating voltage where X>1, such as 1.4 times Vdd in dynamic voltage stress (DVS) testing.

A ramping time (T) (e.g., ramping up or ramping down) may be configured to be substantially equivalent to the power signal 304 of FIG. 3. In some embodiments, the ramping time may be determined based on a response time of the DUT 320. Accordingly, a ramping time for each step of the quasi-power ramping signal can be expressed as (T/n or m*T/n) where n depicts the number of steps and m depicts an extended ramping time. The number of steps (e.g., ramping up or ramping down) may be determined to control the level of damping voltage coupling to RF components of the DUT. As discussed above in FIG. 3, for a single step power signal, an overshoot voltage may be generated at Vpad 322 which may induce damping voltage coupling to the RF network of the DUT 320. For a quasi-power ramping signal, a damping voltage that may be coupled can be expressed as (overshoot voltage/n) where n depicts the number of steps. As such, an increase in the number of steps will decrease the damping voltage that will be coupled (by LC resonance) to the RF network of the DUT 320.

In the present embodiment, the quasi-power ramping signal 402 comprises ten (10) increasing steps that range from ground/0 V (e.g., Vss) to the positive supply voltage (e.g., X times Vdd), and ten (10) decreasing steps that range from the positive supply voltage to ground/0 V. In an example where X=1 (supply voltage is set at normal operating voltage), ramping up by a step of 1/10 Vdd may result in 1/10 overshoot voltage 404 (as compared to the single step power signal 304 of FIG. 3), and ramping down may function in a similar manner. Accordingly, a supply signal 410 provided at Vpad 322 may comprise the overshoot voltage 404 that can be minimized by setting the desired step size and dwell time of the quasi-power ramping signal of the test program. Thus, the unexpected damage caused by damping voltage coupling to the RF network of the DUT can also be minimized by using the quasi-power ramping signal thereby providing more accurate reliability testing assessment.

Figure 5:
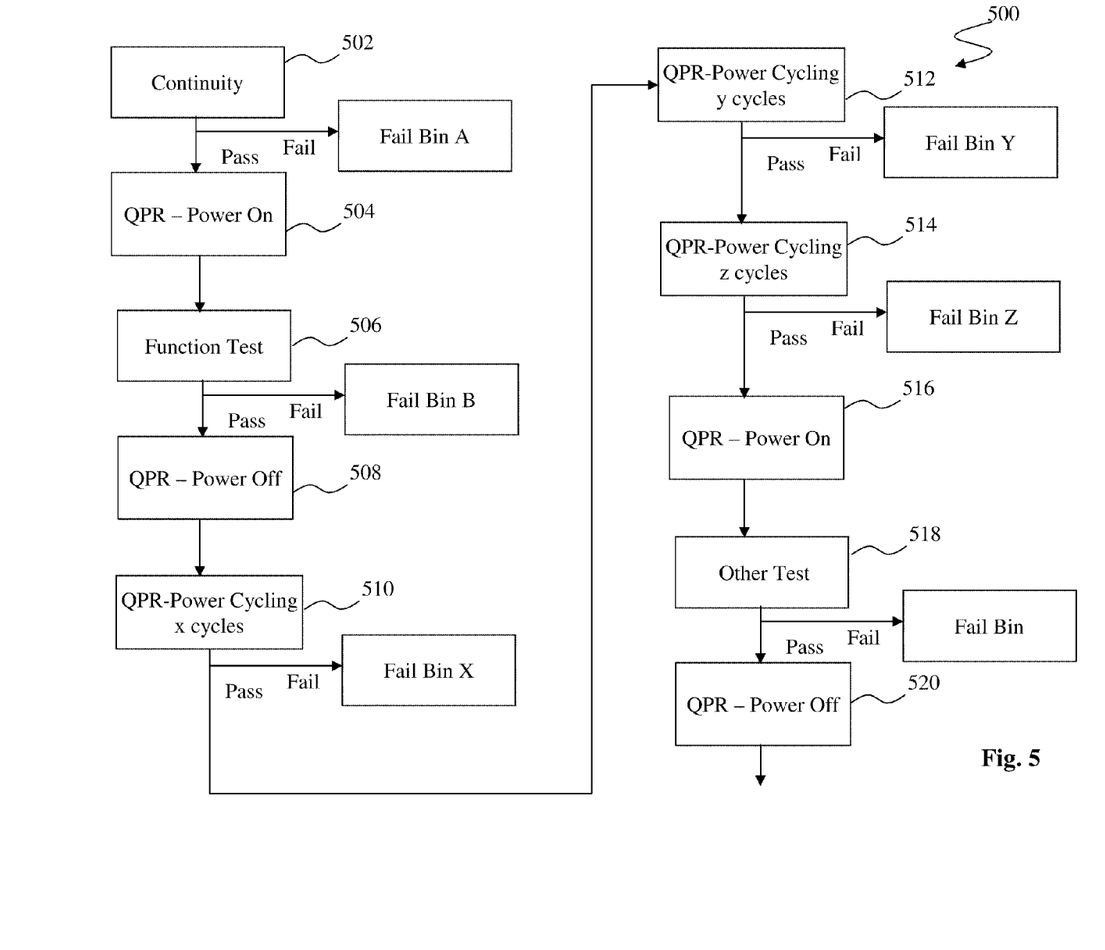
FIG. 5 is a flowchart of a test method including power cycling with quasi-power ramping according to various aspects of the present disclosure.

Referring to FIG. 5, illustrated is a flowchart of a test method 500 including power cycling that is performed with quasi-power ramping (QPR) according to various aspects of the present disclosure. The test method 500 utilizes a quasi-power ramping signal similar to the one disclosed in FIG. 4. The test method 500 is performed to detect problems associated with the fabrication process and to predict early life failure of the DUT. The testing methodology may be referred to as Known Good Die where the bare die is tested and screened at the wafer-level. The test method 500 may be performed using the system 200 of FIG. 2. The method 500 begins with block 502 in which a continuity test is performed on the DUT. The continuity test is operable to detect defects, such as open circuit, with the interconnections of the DUT. If the DUT fails the continuity test, the DUT may be placed in Fail Bin A. Accordingly, other DUTs that fail at a similar stage in the test method 500 may be grouped together for further analysis to determine possible causes of the defects. If the DUT passes the continuity test, the DUT proceeds with testing.

The method 500 continues with block 504 in which the DUT is powered on using the quasi-power ramping signal. The quasi-power ramping signal comprises a plurality of increasing steps that range from 0 V to a supply voltage (e.g., Vdd). The supply voltage is set at a normal operating voltage of the DUT. As noted above, the number of increasing steps may vary depending on test requirements. The method 500 continues with block 506 in which a function test is performed on the DUT. The function test may include various types of test known in the art, and thus is not described in detail herein. For example, the function test may include an IDDQ test. The IDDQ test is operable to measure a supply current of the DUT in a quiescent state (e.g., inputs are held static). The measurements may be stored in memory for subsequent comparison when the IDDQ test is later repeated. If the DUT fails the function test, the DUT may be placed in Fail Bin B. If the DUT passes the function test, the DUT proceeds to block 508 in which the DUT is powered off and the DUT proceeds with testing. The quasi-power ramping signal further comprises a plurality of decreasing steps that range from the supply voltage to 0 V. The number of decreasing steps may be equivalent to the number of increasing steps.

The method 500 continues with block 510 in which a power cycling test is performed on the DUT. The power cycling test functions to stress the DUT and induce failures associated with the fabrication process. The power cycling test utilizes the quasi-power ramping (QPR) signal to power on and power off the DUT at normal operating voltages (e.g., Vdd). The power cycling test is performed for x number of cycles. In an embodiment, x cycles may be equal to 100 on/off cycles. It is understood that the number of cycles may vary depending on test requirements and/or historical data. Reliability analysis may be performed on the DUT to determine whether the DUT has failed due to the power cycling test. For example, the reliability test may include performing another IDDQ test and determining whether there has been a significant change in the supply current as compared to the previous measurements of supply current. If the DUT fails the reliability test, the DUT may be placed in Fail Bin X. If the DUT passes, the DUT proceeds with testing.

The method 500 continues with block 512 in which another power cycling test is performed on the DUT. The power cycling test is similar to the power cycling test of block 510 except that the number of cycles may be increased from x cycles to y cycles to further stress the DUT. In an embodiment, y cycle may be equal to 200 on/off cycles. It is understood that the number of cycles may vary depending on test requirements and/or historical data. In other embodiments, the number of cycles may be the same as the previous power cycling test. Similar to the power cycling test of block 510, the quasi-power ramping (QPR) signal is implemented to power on and power off the DUT at normal operating voltages (e.g., Vdd). Reliability analysis may be performed on the DUT to determine whether the DUT has failed due to the power cycling test. For example, the reliability test may include performing another IDDQ test and determining whether there has been a significant change in the supply current as compared to the previous measurements of the supply current. If the DUT fails the reliability test, the DUT may be placed in Fail Bin Y. If the DUT passes, the DUT proceeds with testing.

The method 500 continues with block 514 in which yet another power cycling test is performed on the DUT. The power cycling test is similar to the previous power cycling test of block 512 except that the number of cycles may be increased from y cycles to z cycles to further stress the DUT. In an embodiment, z cycles may be equal to 300 on/off cycles. In other embodiments, the number of cycles may be the same as the previous power cycling test. Similar to the power cycling test of block 512, the quasi-power ramping (QPR) signal is implemented to power on and power off the DUT at normal operating voltages (e.g., Vdd). Reliability analysis may be performed on the DUT to determine whether the DUT has failed due to the power cycling test. For example, the reliability test may include performing another IDDQ test and determining whether there has been a significant change in the supply current as compared to the previous measurements of supply current. If the DUT fails the reliability test, the DUT may be placed in Fail Bin Z. If the DUT passes, the DUT proceeds with testing.

The method 500 continues with block 516 in which the DUT is powered on using the quasi-power ramping signal. The powering on procedure is similar to the one disclosed in block 504. The method 500 continues with block 518 in which other test may be performed on the DUT. The other test may include various types of test known in the art, and thus are not described in detail herein. For example, a low voltage test may be performed at supply voltages close to threshold voltages of transistors. Also, parameter tests (e.g., parameter scanning) may be performed to measure various electrical parameters of the DUT to determine whether those parameters are within design specifications. Further, AC test and DC test may be performed to determine performance characteristics of the DUT under AC current and voltages and DC current and voltages, respectively. If the DUT fails a particular test, the DUT may be placed in a Fail Bin associated with the particular test.

The method 500 continues with block 520 in which the DUT is powered off using the quasi-power ramping signal. The powering off procedure is similar to the one disclosed in block 508. It should be noted that unexpected damage caused by damping voltage coupling to the RF network of the DUT is minimized by using quasi-power ramping (QPR) thereby providing more accurate performance and reliability testing assessment. It should also be noted that the tests and sequence of tests disclosed above may vary depending on the testing requirements of the manufacturer. If the DUT passes the performance and reliability tests, the DUT may proceed to post processing such as die separation (e.g., dicing) and chip packaging.

Figure 6:
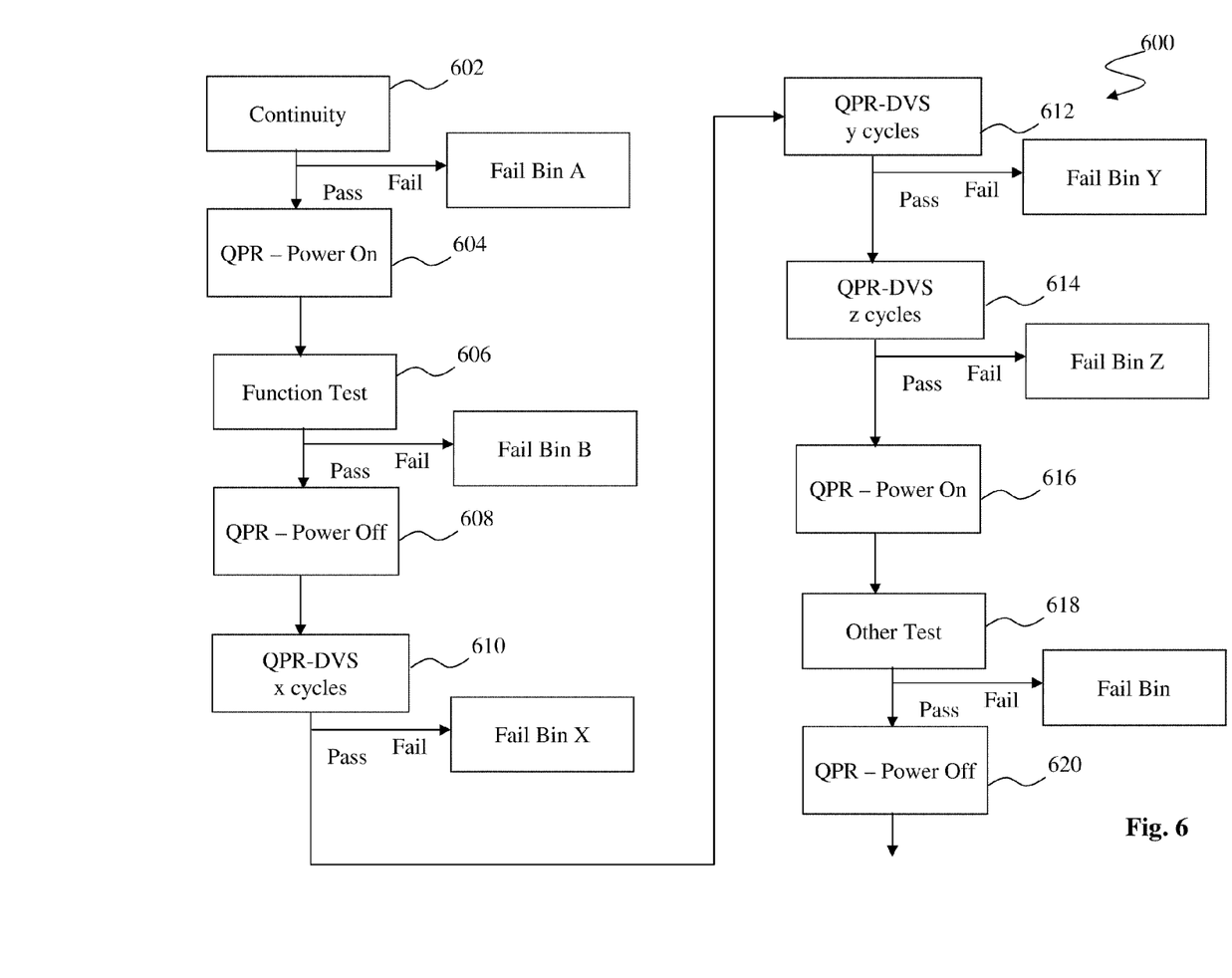
FIG. 6 is a flowchart of a test method according including dynamic voltage stress (DVS) test with quasi-power ramping to various aspects of the present disclosure.

Referring to FIG. 6, illustrated is a flowchart of a test method 600 including dynamic voltage stress (DVS) test that is performed with a quasi-power ramping signal according to various aspects of the present disclosure. The test method 600 utilizes a quasi-power ramping signal similar to the one disclosed in FIG. 4. The test method 600 is performed to detect problems associated with the fabrication process and to predict early life failure of the DUT. The testing methodology may be referred to as Known Good Die where the bare die is tested and screened at the wafer-level. The test method 600 may be performed using the system 200 of FIG. 2. The test method 600 is similar to the test method 500 of FIG. 5 except that the DVS test is implemented to stress the DUT and induce failures. The method 600 begins with block 602 in which a continuity test is performed on the DUT. The continuity test is operable to detect defects, such as open circuit, with the interconnections of the DUT. If the DUT fails the continuity test, the DUT may be placed in Fail Bin A. Accordingly, other DUTs that fail the continuity test may be grouped together in Fail Bin A for further analysis. If the DUT passes the continuity test, the DUT proceeds with testing.

The method 600 continues with block 604 in which the DUT is powered on using the quasi-power ramping signal. The quasi-power ramping signal comprises a plurality of increasing steps that range from 0 V to a supply voltage (e.g., Vdd). The supply voltage is set at a normal operating voltage of the DUT. As noted above, the number of increasing steps may vary depending on test requirements. The method 600 continues with block 606 in which a function test is performed on the DUT. The function test may include various types of test known in the art, and thus is not described in detail herein. For example, the function test may include an IDDQ test. The IDDQ test is operable to measure a supply current of the DUT in a quiescent state (e.g., inputs are held static). The measurements may be stored in memory for subsequent comparison when the IDDQ test is later repeated. If the DUT fails the function test, the DUT may be placed in Fail Bin B. If the DUT passes the function test, the DUT proceeds to block 608 in which the DUT is powered off and the DUT proceeds with testing. The quasi-power ramping signal further comprises a plurality of decreasing steps that range from the supply voltage to 0 V. The number of decreasing steps may be equivalent to the number of increasing steps.

The method 600 continues with block 610 in which a DVS test is performed on the DUT. The DVS test functions to overstress the DUT and induce failures associated with the fabrication process. The DVS test utilizes the quasi-power ramping (QPR) signal to power on the DUT at voltages exceeding normal operating voltages (e.g., X times Vdd) for a period of time. In an embodiment, the supply voltage is equal to 1.4 Vdd. The DVS test is performed for x number of cycles. In an embodiment, x cycles may be equal to 100 on/off cycles. It is understood that the number of cycles may vary depending on test requirements and/or historical data. Reliability analysis may be performed on the DUT to determine whether the DUT has failed due to the DVS test. For example, the reliability test may include performing another IDDQ test and determining whether there has been a significant change in the supply current as compared to the previous measurements of supply current. If the DUT fails the reliability test, the DUT may be placed in Fail Bin X. If the DUT passes, the DUT proceeds with testing.

The method 600 continues with block 612 in which another DVS test is performed on the DUT. The DVS test is similar to the previous DVS test of block 610 except that the number of cycles may be increased from x cycles to y cycles to further overstress the DUT. In an embodiment, y cycles may be equal to 200 on/off cycles. In other embodiments, the number of cycles may be the same as the previous DVS test. Similar to the DVS test of block 610, the quasi-power ramping (QPR) signal is implemented to power on the DUT at voltages that exceed normal operating voltages (e.g., 1.4 Vdd). Reliability analysis may be performed on the DUT to determine whether the DUT has failed due to the DVS test. For example, the reliability test may include performing another IDDQ test and determining whether there has been a significant change in the supply current as compared to the previous measurements of the supply current. If the DUT fails the reliability test, the DUT may be placed in Fail Bin Y. If the DUT passes, the DUT proceeds with testing.

The method 600 continues with block 614 in which yet another DVS test is performed on the DUT. The DVS test is similar to the previous DVS test of block 612 except that the number of cycles may be increased from y cycles to z cycles to further overstress the DUT. In an embodiment, z cycles may be equal to 500 on/off cycles. In other embodiments, the number of cycles may be the same as the previous DVS test. Similar to the DVS test of block 612, the quasi-power ramping (QPR) signal is implemented to power on the DUT at voltages that exceed normal operating voltages (e.g., 1.4 Vdd). Reliability analysis may be performed on the DUT to determine whether the DUT has failed due to the DVS test. For example, the reliability test may include performing another IDDQ test and determining whether there has been a significant change in the supply current as compared to the previous measurements of the supply current. If the DUT fails the reliability test, the DUT may be placed in Fail Bin Z. If the DUT passes, the DUT proceeds with testing.

The method 600 continues with block 616 in which the DUT is powered on using the quasi-power ramping signal. The powering on procedure is similar to the one disclosed in block 604. The method 600 continues with block 618 in which other test may be performed on the DUT. The other test may include various types of test known in the art, and thus are not described in detail herein. For example, the other test may be similar to the ones disclosed in block 518 of FIG. 5. If the DUT fails a particular test, the DUT may be placed in a Fail Bin associated with the particular test. The method 600 continues with block 620 in which the DUT is powered off using the quasi-power ramping signal. The powering off procedure is similar to the one disclosed in block 608. It should be noted that unexpected damage caused by damping voltage coupling to the RF network of the DUT is minimized by using quasi-power ramping (QPR) even with tests that supply voltages that exceed normal operating voltages of the DUT. Also, the number of steps of the quasi-power ramping signal may be increased to further suppress the damping voltage coupling produced by these elevated supply voltages. If the DUT passes the performance and reliability tests, the DUT may proceed to post processing such as die separation (e.g., dicing) and chip packaging.

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method of wafer-level testing, comprising:
providing a wafer having an integrated circuit formed thereon;
applying a signal to energize the integrated circuit, the signal increasing or decreasing between a first level and a second level, wherein the signal includes a plurality of increasing steps or decreasing steps that range between the first level and the second level, the increasing steps include a step voltage/current that increases from a first voltage level/current level to a second voltage level/current level, and the decreasing steps include the step voltage/current that decreases from the second voltage level/current level to the first voltage level/current level; and
determining whether the integrated circuit complies with a test criteria after applying the signal.

2. The method of claim 1, wherein the step voltage/current corresponds to a damping voltage that is expected to be coupled to a radio frequency (RF) circuit of the integrated circuit.

3. The method of claim 1, wherein the test criteria is associated with a dynamic voltage stress test, a power cycling test, a continuity test, or a function test.

4. The method of claim 3, wherein, for the dynamic voltage stress test, the first voltage level/current level is approximately 0 V/0 mA and the second voltage level/current level exceeds a normal operating voltage/current of the integrated circuit.

5. The method of claim 3, wherein, for the power cycling test, the first voltage level/current level is approximately 0 V/0 mA and the second voltage level/current level is approximately equal to a normal operating voltage/current of the integrated circuit.

6. A method of wafer-level testing, comprising:
providing a wafer having an integrated circuit formed thereon;
applying a signal to energize the integrated circuit, the signal increasing or decreasing between a first level and a second level; and
determining whether the integrated circuit complies with a test criteria after applying the signal,
wherein the applying the signal includes applying the signal for a plurality of cycles for a first test;
wherein the method further includes, thereafter applying the signal for another plurality of cycles for a second test and determining whether the integrated circuit complies with the test criteria.

7. The method of claim 6, wherein a number of cycles for the second test is greater than a number of cycles for the first test.

8. The method of claim 1, wherein the integrated circuit includes an inductive element and a capacitive element.

9. A system for semiconductor device testing, comprising:
a signal generator operable to generate a signal, the signal including a plurality of increasing steps or decreasing steps that range between a first voltage level/current level and a second voltage level/current level, wherein the increasing steps include a step voltage/current that increases from the first voltage/current level to the second voltage/current level, and the decreasing steps include the step voltage/current that decreases from the second voltage/current level to the first voltage/current level;
a coupler operable to couple the signal generator to an integrated circuit formed on a wafer; and
a module operable to determine whether the integrated circuit complies with a test criteria after the signal is applied to the integrated circuit.

10. The system of claim 9, wherein the step voltage/current corresponds to a damping voltage that is expected to be coupled to a radio frequency (RF) circuit of the integrated circuit.

11. The system of claim 9, wherein the signal generator is operable to generate the signal for a plurality of cycles for a first test;
wherein the signal generator is operable to generate the signal for another plurality of cycles for a second test; and
wherein the module determines whether the integrated circuit complies with the test criteria for the first test and the second test.

12. The system of claim 9, wherein the test criteria is associated with a dynamic voltage stress test, a power cycling test, a continuity test, or a function test.

13. The system of claim 12, wherein, for the dynamic voltage stress test, the first voltage level/current level is approximately 0 V/0 mA and the second voltage level/current level exceeds a normal operating voltage/current of the integrated circuit.

14. The system of claim 12, wherein, for the power cycling test, the first voltage level/current level is approximately 0 V/0 mA and the second voltage level/current level is approximately equal to a normal operating voltage/current of the integrated circuit.

15. The method of claim 1, wherein the applying the signal includes applying the signal for a first plurality of cycles for a first test and applying the signal for a second plurality of cycles for a second test.

16. The method of claim 6, wherein the signal includes a plurality of increasing steps or decreasing steps, the increasing steps include applying increasing voltage/current steps to the integrated circuit and the decreasing steps include applying decreasing voltage/current steps to the integrated circuit.

17. The method of claim 6, wherein the first level is less than a normal operating voltage/current of the integrated circuit and the second level is approximately equal to the normal operating voltage/current of the integrated circuit.

18. The method of claim 6, wherein at least one of the first and second levels exceeds a normal operating voltage/current of the integrated circuit.

19. The method of claim 6, wherein applying the signal includes applying a quasi-power ramping signal to power on and off the integrated circuit, the quasi-power ramping signal including a plurality of steps that range between the first level and the second level.

20. The method of claim 19, wherein the quasi-power ramping signal includes a first step voltage/current, a second step voltage/current, and a third step voltage current, wherein the first, second, and third step voltage/current are different from each other.

\* \* \* \* \*